US009214342B2

(12) United States Patent
Sazawa

(10) Patent No.: US 9,214,342 B2
(45) Date of Patent: Dec. 15, 2015

(54) METHOD FOR PRODUCING COMPOUND SEMICONDUCTOR CRYSTAL, METHOD FOR PRODUCING ELECTRONIC DEVICE, AND SEMICONDUCTOR WAFER

(75) Inventor: Hiroyuki Sazawa, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 13/421,439

(22) Filed: Mar. 15, 2012

(65) Prior Publication Data
US 2012/0228627 A1 Sep. 13, 2012

Related U.S. Application Data

(63) Continuation-in-part of application No. PCT/JP2010/005648, filed on Sep. 16, 2010.

(30) Foreign Application Priority Data

Sep. 17, 2009 (JP) ................ 2009-215520

(51) Int. Cl.
H01L 29/20 (2006.01)
H01L 21/20 (2006.01)
(Continued)

(52) U.S. Cl.
CPC ............ *H01L 21/0262* (2013.01); *C30B 25/02* (2013.01); *C30B 25/18* (2013.01); *C30B 29/40* (2013.01); *C30B 29/48* (2013.01); *H01L 21/02381* (2013.01); *H01L 21/02395* (2013.01); *H01L 21/02441* (2013.01);

(Continued)

(58) Field of Classification Search
CPC ......... H01L 25/02; H01L 29/20; H01L 21/20; H01L 29/06
USPC .............................. 257/76, 103, 615
See application file for complete search history.

(56) References Cited

U.S. PATENT DOCUMENTS 3,993,533 A * 11/1976 Milnes et al. ............ 117/88
4,159,354 A 6/1979 Milnes et al.
(Continued)

FOREIGN PATENT DOCUMENTS

JP 51-123591 A 10/1976
JP 61-135115 A 6/1986
(Continued)

OTHER PUBLICATIONS

Kim et al., "Quality-enhanced GaAs layers grown on Ge/Si substrates by metalorganic chemical vapor deposition", Journal of Crystal Growth, pp. 427-432.*

(Continued)

*Primary Examiner* — Evan Pert
*Assistant Examiner* — Damon Hillman
(74) *Attorney, Agent, or Firm* — Sughrue Mion, PLLC

(57) ABSTRACT

A method for producing a compound semiconductor crystal, includes; a sacrificial layer formation step of forming a sacrificial layer containing $C_{x1}Si_{y1}Ge_{z1}Sn_{1-x1-y1-z1}$ ($0 \le x1 < 1$, $0 \le y1 \le 1$, $0 \le z1 \le 1$, and $0 < x1+y1+z1 \le 1$), on a base wafer whose surface is made of a silicon crystal; a crystal formation step of forming, on the sacrificial layer, a compound semiconductor crystal lattice-matching or pseudo lattice-matching the sacrificial layer; and a crystal removal step of removing the compound semiconductor crystal from the base wafer, by etching the sacrificial layer.

15 Claims, 10 Drawing Sheets

(51) Int. Cl.

| | | |
|---|---|---|
| *H01L 29/06* | (2006.01) | |
| *H01L 21/02* | (2006.01) | |
| *C30B 25/02* | (2006.01) | |
| *C30B 25/18* | (2006.01) | |
| *C30B 29/40* | (2006.01) | |
| *C30B 29/48* | (2006.01) | |
| *H01L 21/18* | (2006.01) | |
| *H01L 33/00* | (2010.01) | |

(52) U.S. Cl.
CPC ... *H01L 21/02521* (2013.01); *H01L 21/02546* (2013.01); *H01L 21/02639* (2013.01); *H01L 21/187* (2013.01); *H01L 33/007* (2013.01); *H01L 33/0079* (2013.01); *H01L 2924/0002* (2013.01)

(56) References Cited

U.S. PATENT DOCUMENTS

| | | | | |
|---|---|---|---|---|
| 4,614,564 A | * | 9/1986 | Sheldon et al. | 438/492 |
| 4,819,040 A | * | 4/1989 | Tobin | 257/369 |
| 5,239,188 A | * | 8/1993 | Takeuchi et al. | 257/76 |
| 6,232,623 B1 | * | 5/2001 | Morita | 257/103 |
| 7,160,819 B2 | * | 1/2007 | Conley et al. | 438/778 |
| 2004/0135157 A1 | | 7/2004 | Ogihara et al. | |

FOREIGN PATENT DOCUMENTS

| | | | |
|---|---|---|---|
| JP | 2004-207323 A | | 7/2004 |
| JP | 2006-237339 A | | 9/2006 |
| JP | 2006237339 A | * | 9/2006 |
| WO | 2009/084238 A1 | | 7/2009 |

OTHER PUBLICATIONS

Japanese Office Action issued in JP Application No. 2010-207222, dated Apr. 15, 2014.

Cheskis, D., et al., "Co-Integration of GaAlAs/GaAs HBTs and GaAs FETs with a Simple, Manufacturable Process," IEDM 92-91, IEEE, 1992, pp. 4.6.1-4.6.4.

Itakura, K., et al., "A GaAs Bi-FET Technology for Large Scale Integration," IEDM 89-389, IEEE, 1989, pp. 15.2.1-15.2.4.

Translation of International Preliminary Report on Patentability and Written Opinion dated Apr. 19, 2012, in International Application No. PCT/JP2010/005648.

Office Action in corresponding Taiwanese application No. 099131584 dated Jan. 29, 2015.

* cited by examiner

METHOD FOR PRODUCING COMPOUND SEMICONDUCTOR CRYSTAL, METHOD FOR PRODUCING ELECTRONIC DEVICE, AND SEMICONDUCTOR WAFER

The contents of the following Japanese patent application and PCT patent application are incorporated herein by reference:
  JP2009-215520 filed on Sep. 17, 2009, and
  PCT/JP2010/005648 filed on Sep. 16, 2010.

TECHNICAL FIELD

The present invention relates to a method for producing a compound semiconductor crystal, a method for producing an electronic device, and a semiconductor wafer.

BACKGROUND ART

Patent Document 1 discloses a production process of a complex semiconductor device. Specifically in this production process, after an InGaP layer is formed on a GaAs wafer as an etching stop layer, an AlAs layer is formed as a removal layer. Thereafter, a GaAs crystal layer is formed. Subsequently, a groove is formed to the wafer by lithography, from the surface of the wafer to the removal layer. Then using thus formed groove, an etchant is made to be in contact with the AlAs removal layer, to remove the AlAs removal layer, thereby removing the GaAs crystal layer from the GaAs wafer to produce an independent GaAs crystallization (LED epifilm). Next, the independent GaAs crystallization is attached to a silicon wafer, and wiring or the like is formed on the GaAs crystallization, to produce an LED array. Note that a removal layer is also called a sacrificial layer.
Patent Document 1: JP2004-207323 A

SUMMARY OF THE INVENTION

Problems to be Solved by the Invention

A GaAs wafer, based on which a GaAs compound semiconductor crystal layer is formed, costs high. A Ge wafer pseudo lattice-matching GaAs, which can also be used to form a GaAs compound semiconductor crystal layer, is also expensive. Therefore, if a GaAs wafer or a Ge wafer is used in its creation, the resulting semiconductor device costs high. Adding an InGaP layer on the GaAs wafer as an etching stop layer, and forming a groove from the surface of the wafer to the removal layer would further elevate the cost.

When a GaAs compound semiconductor crystal layer is produced with use of an etching stop layer made of InGaP and a removal layer made of AlAs, an additional problem of light amount shortage arises in a light emitting device manufactured using the GaAs compound semiconductor crystal layer, attributed to the adverse effect of the crystal defects inherent in the GaAs compound semiconductor crystal layer.

Means for Solving the Problems

In view of the above discussions, according to the first aspect related to the present invention, provided is a method for producing a compound semiconductor crystal, including; a sacrificial layer formation step of forming a sacrificial layer containing $C_{x1}Si_{y1}Ge_{z1}Sn_{1-x1-y1-z1}$ ($0 \le x1 < 1$, $0 \le y1 \le 1$, $0 \le z1 \le 1$, and $0 < x1+y1+z1 \le 1$), on a base wafer whose surface is made of a silicon crystal; a crystal formation step of forming, on the sacrificial layer, a compound semiconductor crystal lattice-matching or pseudo lattice-matching the sacrificial layer; and a crystal removal step of removing the compound semiconductor crystal from the base wafer, by etching the sacrificial layer.

In the crystal removal step, the compound semiconductor crystal is etched selectively with respect to the sacrificial layer, for example. The crystal formation step may include a first growth step of growing the compound semiconductor crystal at a temperature in the range of from 400° C. to 600° C., and a second growth step of further growing the compound semiconductor crystal at a temperature higher than the growth temperature adopted in the first growth step. In the crystal formation step, the compound semiconductor crystal may be grown on the sacrificial layer while keeping part of the sacrificial layer formed on the base wafer in an exposed state.

The method for producing a compound semiconductor crystal, may further include, prior to the sacrificial layer formation step, an inhibition layer formation step of forming, on the base wafer, an inhibition layer that inhibits growth of the sacrificial layer and the compound semiconductor crystal; and an aperture formation step of forming, in the inhibition layer, an aperture in which a part of the base wafer is exposed, where the sacrificial layer is crystal grown inside the aperture. The aperture formation step includes a step of etching the inhibition layer, for example. A gap may be created between the sacrificial layer and the inhibition layer during the sacrificial layer formation step.

The method for producing a compound semiconductor crystal may further include, between the crystal formation step and the crystal removal step, a step of annealing the sacrificial layer. The annealing in the step of annealing is conducted twice or more times. The method for producing a compound semiconductor crystal may further include, between the sacrificial layer formation step and the crystal formation step, a step of bringing a plane of the sacrificial layer into contact with a gas containing a phosphorous compound, the plane facing the compound semiconductor crystal.

For example, the compound semiconductor crystal is either a Group III-V compound semiconductor crystal or a Group II-VI compound semiconductor crystal. The Group III-V compound semiconductor crystal includes at least one of Al, Ga, and In as a Group III element, and at least one of N, P, As, and Sb as a Group V element. The inhibition layer is, for example, a silicon oxide layer, a silicon nitride layer, a silicon oxynitride layer, an aluminum oxide layer, or a stack of two or more of the preceding layers. The method for producing a compound semiconductor crystal may further include, between the crystal formation step and the crystal removal step, a step of supporting the compound semiconductor crystal by a supporting member.

According to the second aspect related to the present invention, provided is a method for producing an electronic device, including a step of forming a function crystal in which the compound semiconductor crystal obtained by the aforementioned method has been provided with an electrode and wiring. The method for producing an electronic device may further include: a step of preparing an attachment base wafer that is different from the base wafer; and a step of attaching the function crystal to the attachment base wafer. The method for producing an electronic device may further include a step of attaching a plurality of said function crystals to the attachment base wafer.

According to the third aspect related to the present invention, provided is a semiconductor wafer including: a base wafer whose surface is made a silicon crystal; an inhibition layer provided on the base wafer, the inhibition layer being to inhibit crystal growth and including an aperture in which a part of the base wafer is exposed; a sacrificial layer formed on the base wafer inside the aperture, the sacrificial layer containing $C_{x1}Si_{y1}Ge_{z1}Sn_{1-x1-y1-z1}$ (0≤x1<1, 0≤y1≤1, 0≤z1≤1, and 0<x1+y1+z1≤1); and a compound semiconductor crystal provided on the sacrificial layer, the compound semiconductor crystal containing a compound semiconductor lattice-matching or pseudo lattice-matching the sacrificial layer, where the semiconductor wafer has a gap between the sacrificial layer and the inhibition layer. A direction in which a sidewall of the inhibition layer facing the aperture may be tilted with respect to a stacking direction in which the base wafer and the sacrificial layer are stacked is 0.5 degrees or more. The compound semiconductor crystal is made of GaAs, AlGaAs, GaN, or AlGaN, and the sacrificial layer is made of Ge or SiGe, for example.

MODE FOR CARRYING OUT THE INVENTION

Figure 1:
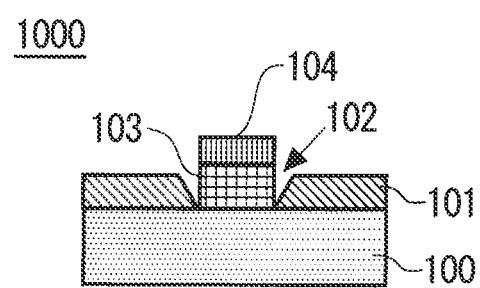
FIG. 1 shows the configuration of a semiconductor wafer 1000 according to the present embodiment.

FIG. 1 shows the configuration of a semiconductor wafer 1000 according to the present embodiment. The semiconductor wafer 1000 includes a base wafer 100, an inhibition layer 101, a sacrificial layer 103, and a compound semiconductor crystal 104.

The surface of the base wafer 100 is made of silicon crystals. In other words, the base wafer 100 includes a region made of silicon crystals on its surface. An exemplary base wafer 100 is a Si wafer the entirety of which is made of silicon crystals, or a SOI (silicon-on-insulator) wafer.

The SOI wafer is a wafer made by forming silicon crystals on the surface of an insulation wafer such as a sapphire wafer, a glass wafer, etc. The silicon crystals may contain impurities. Note that the concept of "a wafer whose surface is made of silicon crystals" includes a wafer in which an ultra-thin silicon oxide layer such as a natural oxide layer or a silicon nitride layer is formed on the silicon crystals on the surface of the wafer.

The present embodiment explains an example in which a Si wafer is used as a base wafer 100. For example, the surface of the base wafer 100 is (100) plane, (110) plane, (111) plane, or a plane equivalent to them. The surface of the base wafer 100 may be slightly tilted with respect to these crystal plane orientations. In other words, the base wafer 100 may have "off angle." An exemplary off angle is 10 degrees or below. A preferable range of the off angle is from 0.05 degrees to 6 degrees. A more preferable range of the off angle is from 0.3 degrees to 6 degrees.

The inhibition layer 101 inhibits crystal growth of the sacrificial layer 103 and the compound semiconductor crystal 104. In other words, the sacrificial layer 103 and the compound semiconductor crystal 104 are formed, by crystal growth, in the region in which no inhibition layer 101 is formed. The inhibition layer 101 is formed on the base wafer 100, and includes an aperture 102 reaching the base wafer 100. The aperture 102 may be formed by lithography for example.

When the sacrificial layer 103 and the compound semiconductor crystal 104 are formed inside the aperture 102, it is preferable that the surface of the base wafer 100 be (100) plane, (110) plane, or a plane equivalent to (100) plane or (110) plane respectively. When the surface of the base wafer 100 is one of the aforementioned planes, four symmetrical side surfaces easily appear on the sacrificial layer 103 and the compound semiconductor crystal 104. When four symmetrical side surfaces appear on the sacrificial layer 103 and the compound semiconductor crystal 104, the reproduction of the etching rate on the sacrificial layer 103 and the compound semiconductor crystal 104 becomes high, which makes the etching time control easier.

The sacrificial layer 103 is removed when the compound semiconductor crystal 104 is removed from the semiconductor wafer 1000. The sacrificial layer 103 is formed in the aperture 102, to be in contact with the base wafer 100. The sacrificial layer 103 contains $C_{x1}Si_{y1}Ge_{z1}Sn_{1-x1-y1-z1}$ (0≤x1<1, 0≤y1≤1, 0≤z1≤1, and 0<x1+y1+z1≤1). For example, the sacrificial layer 103 may be a Ge layer, SiGe layer, or a SiC layer.

For example, the compound semiconductor crystal 104 may constitute a field effect transistor or a light emitting diode (LED). In an example, the compound semiconductor crystal 104 functions as a channel along which carriers move in the field effect transistor. The compound semiconductor crystal 104 lattice-matches or pseudo lattice-matches the sacrificial layer 103. The compound semiconductor crystal 104 may have a crystal layer structure.

In the present specification, "pseudo lattice-match" is used to describe a phenomenon where the difference in lattice constant between two semiconductors in contact with each other is small although not a complete lattice-match, and so the occurrence of defects due to the lattice mismatch is not noticeable and the two semiconductors can still be stacked. When the semiconductors "pseudo lattice-match," the crystal lattices of the semiconductors deform within the elastically deformable range, thereby absorbing the difference in lattice constant. For example, when Ge and GaAs, or Ge and InGaP are stacked within the lattice relaxation limit thickness, they "pseudo lattice-match."

The compound semiconductor crystal 104 may be a Group III-V compound semiconductor crystal or a Group II-VI compound semiconductor crystal, for example. The Group III-V compound semiconductor contains at least one of Al, Ga, and In as a Group III element, and contains at least one of N, P, As, and Sb as a Group V element. The compound semiconductor crystal 104 may be GaAs, AlGaAs, or InGaAs, for example. The Group II-VI compound semiconductor may be ZnO, CdTe, and ZnSe, for example.

When the sacrificial layer 103 contains $C_{x1}Si_{y1}Ge_{z1}Sn_{1-x1-y1-z1}$ (0≤x1≤1, 0≤y1≤1, 0≤z1≤1, and 0<x1+y1+z1≤1), the etching selectivity with respect to the compound semiconductor crystal 104 is larger than when the sacrificial layer 103 is AlAs. Specifically, when the compound semiconductor crystal 104 is GaAs, AlGaAs, GaN, or AlGaN, it is preferable that the sacrificial layer 103 be Ge or SiGe.

For example, the etchant may be hydrofluoric acid, acetic acid, phosphoric acid, hydrogen peroxide solution, aqueous sodium hydroxide, aqueous potassium hydroxide, aqueous potassium ferrocyanide, aqueous magnesium ferrocyanide, or aqueous potassium chromate. The etchant may also be a mixture of two or more of them.

When the compound semiconductor crystal 104 and the sacrificial layer 103 have the aforementioned composition, the removal of the compound semiconductor crystal 104 can be pursued with little etching damage to the compound semiconductor crystal 104. In addition, because of the crystalline superiority of the sacrificial layer 103 having the aforementioned composition to AlAs, the compound semiconductor crystal 104 having grown on the sacrificial layer 103 having the aforementioned composition has a smaller defect density than the GaAs layer formed on the AlAs layer. This helps improve the electrical characteristics of the light emitting devices or electronic devices formed on the compound semiconductor crystal 104.

Figure 2A:
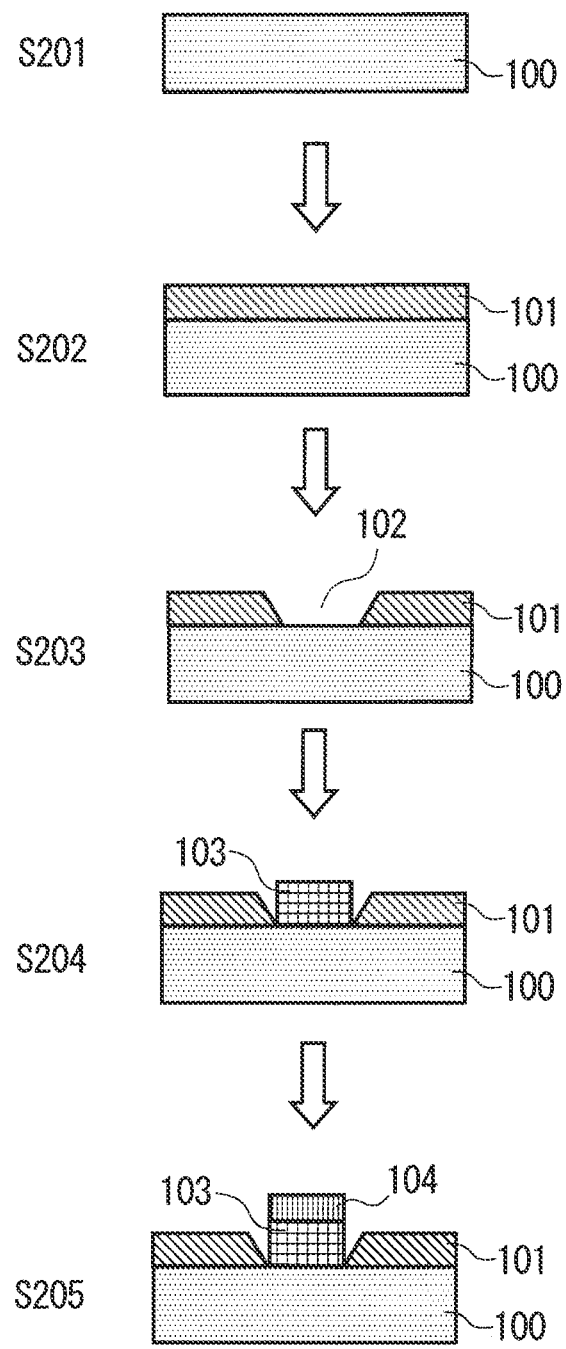
FIG. 2A shows a method for producing a semiconductor wafer 1000.

FIG. 2A shows a method for producing a semiconductor wafer 1000. A base wafer 100 is prepared in S201. In S202, an inhibition layer 101 is formed on the base wafer 100. For example, the inhibition layer 101 is made by stacking a silicon oxide layer, a silicon nitride layer, a silicon oxynitride layer, an aluminum oxide layer, or a stack of two or more of these layers. The inhibition layer 101 may be formed by evaporation, sputtering, CVD, or the like.

Preferably, the inhibition layer 101 is thicker than a predetermined thickness so as to maintain a stable surface shape. However, a too thick inhibition layer 101 may prevent the etchant from reaching the sacrificial layer 103. The thickness of the inhibition layer 101 is preferably determined taking these aspects into consideration. Specifically, an example of the thickness of the inhibition layer 101 is from 2 nm to 500 nm. Preferably, the thickness of the inhibition layer 101 is from 5 nm to 200 nm, and more preferably from 10 nm to 100 nm.

In S203, an aperture 102 is provided through the inhibition layer 101, to reach the base wafer 100. The aperture 102 can be formed either by etching using a chemical solution by using a photoresist formed by photolithography as a mask, or dry etching which uses gas plasma.

Preferably, the width of the inhibition layer 101 in the direction vertical to the surface of the base wafer 100 narrows in the vicinity of the aperture 102 towards the boundary between the bottom of the aperture 102 and the inhibition layer 101. In other words, it is preferable that the sidewall of the inhibition layer 101 forming the aperture 102 have a tapering shape. Here, the bottom of the aperture 102 is defined to be the inside of the aperture 102, in which the base wafer 100 is exposed.

The tapering shape of the inhibition layer 101 causes, to expose, a part of the sacrificial layer 103 formed in the aperture 102 in S204. As a result, the gap between the sacrificial layer 103 and the inhibition layer 101 widens, to make it easy for the etchant to reach the sacrificial layer 103. This helps shorten the duration of etching required to remove the sacrificial layer 103.

The tapering angle of the sidewall of the inhibition layer 101 which forms the aperture 102 is 0.5 degrees or more, in an example. Preferably this tapering angle is 1 degree or more, more preferably 5 degrees or more, and still more favorably 10 degrees or more. Here, the tapering angle of the sidewall of the inhibition layer 101 is defined to be the angle at which the sidewall is tilted with respect to the direction in which the base wafer 100 and the sacrificial layer 103 are stacked.

The bottom area of the aperture 102 is 0.01 mm$^2$ or smaller, in an example. Preferably this bottom area is 1600 μm$^2$ or smaller, and more preferably 900 μm$^2$ or smaller. Here, the bottom area of the aperture 102 is the area of the bottom of the aperture 102.

The bottom area of the aperture 102 is preferably 25 μm$^2$ or more, with which the crystal growth rate is more stable and it is hard to cause disturbance in the crystal shape. The mentioned range of bottom area is also desirable from the production efficiency point of view, since it enhances the yield by making it easier to process the crystals and to produce a device.

The ratio of the bottom area of the aperture 102 to the area of the base wafer 100 covered with the inhibition layer 101 is preferably 0.01% or more, with which a crystal can be formed in the aperture 102 at a more stable growth rate. Note that when a plurality of apertures 102 are formed in the inhibition layer 101, the mentioned ratio is calculated for the summation of the bottom areas of all the apertures 102 formed in the inhibition layer 101.

When the bottom shape of the aperture 102 is square or rectangular, the length of one side of the bottom (a long side when it is rectangular) is 100 μm or smaller, in an example. Preferably, the mentioned length is 80 μm or smaller, and more preferably 40 μm or smaller, and still more preferably 30 μm or smaller. When the length of one side of the bottom of the aperture 102 is 100 μm or smaller, the time required for annealing the sacrificial layer 103 formed inside the aperture 102 can be reduced compared to the case in which the length of one side of the bottom is greater than 100 μm.

When the length of one side of the bottom of the aperture 102 is 100 μm or smaller, the occurrence of crystal defect can be restrained at the compound semiconductor crystal 104 formed above the sacrificial layer 103 in S205, even when there is a large difference in thermal expansion coefficient between the base wafer 100 and the compound semiconductor crystal 104. In addition, the time required for removing the sacrificial layer 103 by etching can also be reduced.

When the length of one side of the bottom of the aperture 102 is 80 μm or smaller, on the other hand, a device having higher performance can be produced by using the compound semiconductor crystal 104 formed in the aperture 102. In the case where the length of one side of the bottom of the aperture 102 is 40 μm or smaller, the devices can be produced with favorable yields.

In S204, on the base wafer 100, a sacrificial layer 103 is formed which is made of a semiconductor represented by $C_{x1}Si_{y1}Ge_{z1}Sn_{1-x1-y1-z1}$ ($0 \leq x1 < 1$, $0 \leq y1 \leq 1$, $0 \leq z1 \leq 1$, and $0 < x1+y1+z1 \leq 1$). Specifically, the sacrificial layer 103 is formed by crystal growth, on the base wafer 100 exposed inside the aperture 102 formed in the inhibition layer 101. The crystal growth may be epitaxial growth for example. When the sacrificial layer 103 is obtained by epitaxial growth, the sacrificial layer 103 is formed except on the upper plane of the inhibition layer 101, because the inhibition layer 101 inhibits the growth of the sacrificial layer 103.

The sacrificial layer 103 preferably has such a shape that it narrows as it grows. For example, a preferable shape of the sacrificial layer 103 is a trapezoid. When the sacrificial layer 103 has a trapezoidal shape, a gap can be created between the sacrificial layer 103 and the inhibition layer 101, which makes it easier for the etchant to reach the sacrificial layer 103 which helps shorten the etching time.

The tapering angle of the sacrificial layer 103 is 0.5 degrees or more, in an example, preferably 1 degree or more, and more preferably 10 degrees or more. The tapering angle of the sacrificial layer 103 is an angle of the sidewall of the sacrificial layer 103 in the tilting direction with respect to the direction in which the base wafer 100 and the sacrificial layer 103 are stacked. The tapering angle can be controlled by the pressure and temperature within the furnace in which the sacrificial layer 103 is formed by crystal growth. For example, when the pressure is large and the temperature is high within the furnace, the resulting tapering angle will be large.

It is preferable to anneal the sacrificial layer 103 with temperature and time duration with which the crystal defects of the sacrificial layer 103 can move. The annealing may be repeated a plurality of times. Annealing the sacrificial layer 103 helps move around the crystal defects within the sacrificial layer 103, to be caught either at the interface between the sacrificial layer 103 and the inhibition layer 101, the surface of the sacrificial layer 103, or the gettering sink inside the sacrificial layer 103, for example. Catching the crystal defects at the gettering sink helps eliminate the crystal defects near the surface of the sacrificial layer 103.

Note that the interface between the sacrificial layer 103 and the inhibition layer 101, the surface of the sacrificial layer 103, or the gettering sink inside the sacrificial layer 103 are merely some examples of a defect catching section that catches crystal defects movable inside the sacrificial layer 103. The defect catching section may be an interface or a surface of a crystal, or physical flaws of a crystal. The defect catching section is preferably positioned at a distance with which crystal defects can move in temperature and duration adopted for annealing.

The temperature adopted for annealing the sacrificial layer 103 is 900° C. or smaller in an example, and is preferably at 850° C. or smaller. By annealing the sacrificial layer 103 in the range of temperatures stated above, the surface of the sacrificial layer 103 can maintain its flatness. The flatness of the surface of the sacrificial layer 103 is especially important when stacking another layer on this surface of the sacrificial layer 103.

A temperature adopted for annealing the sacrificial layer 103 can be 680° C. or more in an example, and is preferably 700° C. or more. By annealing the sacrificial layer 103 in the range of temperatures stated above, the density of the crystal defects in the sacrificial layer 103 can be more decreased. Therefore, a preferable temperature condition used for annealing the sacrificial layer 103 is a range from 680° C. to 900° C. The duration for one round of annealing is preferably 1 minute or longer, and more preferably 5 minutes or longer. The crystallinity improves as the annealing duration gets longer. However, from the production efficiency point of view, the annealing should be preferably no longer than 120 minutes.

In an example, the sacrificial layer 103 is annealed in an atmosphere, a nitrogen atmosphere, an argon atmosphere, or a hydrogen atmosphere. In particular, if the sacrificial layer 103 is annealed in a hydrogen-containing atmosphere, the surface of the sacrificial layer 103 can be kept smooth, while further reducing the density of the crystal defects of the sacrificial layer 103. If the crystal defect density of the sacrificial layer 103 is further decreased, the light emitting devices or the electronic devices to be formed on the compound semiconductor crystal 104 can operate with even higher performance.

In the present embodiment, prior to forming a compound semiconductor crystal 104 on the sacrificial layer 103, it is preferable to conduct a process of bringing the surface of the sacrificial layer 103 which is to face the compound semiconductor crystal 104 into contact with a gas containing phosphorous compound. By bringing the sacrificial layer 103 into contact with a gas containing a phosphorous compound, the surface of the sacrificial layer 103 will be more smoothed out. The phosphorous compound may be phosphine or alkyl phosphine such as tertiary butyl phosphine for example, and is preferably phosphine. The process of bringing the sacrificial layer 103 into contact with a gas containing a phosphorous compound is conducted after the process of annealing the sacrificial layer 103 if the annealing is conducted.

In S205, the compound semiconductor crystal 104 is formed on the sacrificial layer 103. When the compound semiconductor crystal 104 is a Group III-V compound semiconductor crystal, the compound semiconductor crystal 104 is formed on the sacrificial layer 103, for example under a temperature condition in a range from 400° C. to 1000° C., and preferably under a temperature condition in a range from 500° C. to 800° C. When the compound semiconductor crystal 104 is formed by a growth method, the compound semiconductor crystal 104 is first grown at a lower temperature in the first step, and then at a higher temperature in the second step.

The growth temperature adopted in the first step is in a range of from 400° C. to 600° C. for example, and is preferably from 400° C. to 550° C. The growth temperature adopted in the second step is preferably higher than the growth temperature adopted in the first step. In fact, the growth temperature that should be adopted in the second step is in a range of from 500° C. to 1000° C. for example, and is preferably from 550° C. to 800° C. The two-step crystal growth as stated above further enhances the crystallinity of the compound semiconductor crystal 104.

The thickness of the compound semiconductor crystal 104 resulting from the first step is for example from 5 nm to 300 nm, preferably from 10 nm to 200 nm, and further preferably from 15 nm to 100 nm. The thickness of the compound semiconductor crystal 104 resulting from the second step is for example from 5 nm to 300 nm, preferably from 10 nm to 200 nm, and further preferably from 15 nm to 100 nm. If necessary, the temperature with which the compound semiconductor crystal 104 is grown can be raised from low to high in three or more steps.

The compound semiconductor crystal 104 is preferably grown on the sacrificial layer 103, with a part of the sacrificial layer 103 kept exposed. For example, the compound semiconductor crystal 104 is preferably grown on the sacrificial layer 103, with a side surface of the sacrificial layer 103 kept exposed. By keeping the state in which a side surface of the sacrificial layer 103 is exposed, the etchant will easily reach the sacrificial layer 103 in the etching process to remove the compound semiconductor crystal 104 from the wafer. This will lead to removal of the compound semiconductor crystal 104 from the base wafer 100 without any special process such as etching of the compound semiconductor crystal 104.

The compound semiconductor crystal 104 preferably has such a shape that it narrows as it grows. In an example, the compound semiconductor crystal 104 has such a shape that its cross section is trapezoidal. The tapering angle of the compound semiconductor crystal 104 is 0.5 degrees or more in an example, preferably 1 degree or more, more preferably 5 degrees or more, and still more preferably 10 degrees or more.

It is possible to expose at least a part of the side surface of the sacrificial layer 103, by making the sacrificial layer 103 thicker than the inhibition layer 101. By making the sacrificial layer 103 thicker than the inhibition layer 101, the etchant will easily reach the sacrificial layer 103 in the etching process to remove the compound semiconductor crystal 104, and so no special process (e.g. etching) is required for the compound semiconductor crystal 104 in removing the compound semiconductor crystal 104.

The compound semiconductor crystal 104 has a crystal layer structure that is in accordance with the characteristics and functions required of an electronic device produced using the compound semiconductor crystal 104. For example, the compound semiconductor crystal 104 is used in photodiodes, LED, bipolar transistors, or field effect transistors.

An electronic device can be produced by mounting an electrode to the compound semiconductor crystal 104. The electrode is either an ohmic electrode or a Schottky electrode. In an example where the compound semiconductor crystal 104 is used in making an LED device, a p-type crystal layer and an n-type crystal layer formed on the compound semiconductor crystal 104 are etched to be exposed in advance. An LED device can be produced by forming an ohmic electrode on the exposed crystal plane, and providing conducting wiring to the electrode.

Figure 2B:
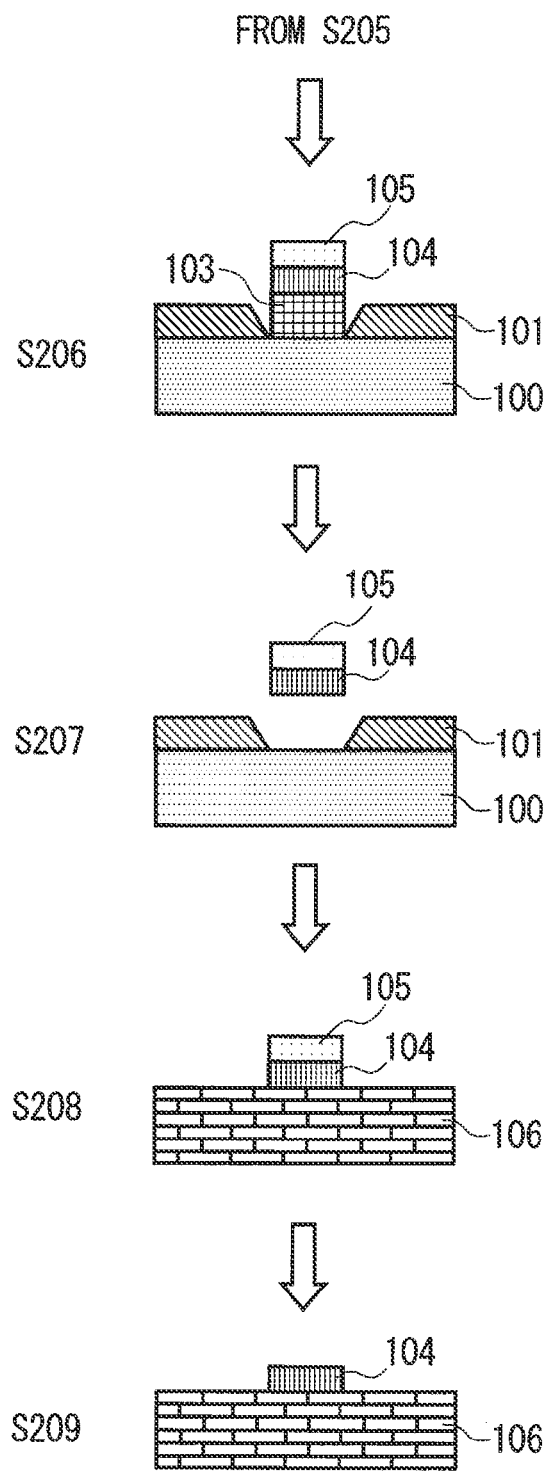
FIG. 2B shows a method for producing a compound semiconductor crystal 104 removed from a base wafer 100.

FIG. 2B shows a method for producing a compound semiconductor crystal 104 removed from a base wafer 100. In S206, a support member 105 is provided on the semiconductor wafer 1000 produced according to the production method shown in FIG. 2A. The support member 105 is used to support the compound semiconductor crystal 104 removed from the base wafer 100. In an example, the support member 105 is adhesive resin wax or a vacuum chuck.

In S207, the compound semiconductor crystal 104 is removed from the base wafer 100, by conducting selective etching to the compound semiconductor crystal 104 to remove the sacrificial layer 103. After removing the compound semiconductor crystal 104 from the base wafer 100, the compound semiconductor crystal 104 will be an independent crystal. Next, the sacrificial layer 103 is removed by wet etching using a chemical solution as an etchant.

Here, such an expression as "conducting selective etching to the compound semiconductor 104 to remove the sacrificial layer 103" is to etch the sacrificial layer 103 at a greater etching rate than when the compound semiconductor crystal 104 is etched. For example, the etching of S207 is conducted by using an etchant which results in larger etching rate for the sacrificial layer 103 than for the compound semiconductor crystal 104.

For example, the etchant may be hydrofluoric acid, acetic acid, phosphoric acid, hydrogen peroxide solution, aqueous sodium hydroxide, aqueous potassium hydroxide, aqueous potassium ferrocyanide, aqueous magnesium ferrocyanide, or aqueous potassium chromate. The etchant may also be a mixture of two or more of them. The etchant may be heated or agitated. The etching may be pursued while being irradiated with ultraviolet light. During etching, the semiconductor wafer 1000 may be oscillated or rotated.

In S208, the compound semiconductor crystal 104 supported by the supporting member 105 is attached to an attachment base wafer 106. The attachment base wafer 106 is a Si wafer, a silicon nitride wafer, a silicon oxide wafer, a silicon carbide wafer, a metal wafer, or a ceramic wafer, for example. The attachment base wafer 106 is preferably a Si wafer. It is possible to stack an attaching base metal on the attachment surface of the attachment base wafer 106. An exemplary attachment base metal is gold or palladium. The compound semiconductor crystal 104 can be attached to the attachment base wafer 106, by any of Van der Waals bonding, solder welding, or adhesive resin attachment.

In S209, the support member 105 is removed from the compound semiconductor crystal 104 with the support member 105, which has been attached to the attachment base wafer 106. The compound semiconductor crystal 104 attached to the attachment base wafer 106 can thus be obtained.

Although FIG. 2B shows a single compound semiconductor crystal 104 on the attachment base wafer 106, there can be a plurality of compound semiconductor crystals 104 on the attachment base wafer 106. For example, the compound semiconductor crystals 104 may be arranged in an array on the attachment base wafer 106. Two or more types of compound semiconductor crystals 104 differing from each other in function may be attached to the attachment base wafer 106. By attaching a plurality of types of compound semiconductor crystals 104 onto the attachment base wafer 106, a monolithic device wafer having multiple functions can be produced.

Figure 3:
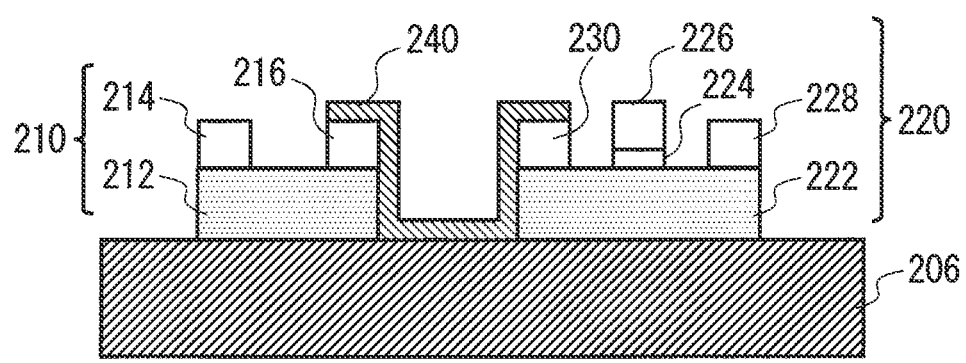
FIG. 3 shows the configuration of an LED device 2000 according to the present embodiment.

FIG. 3 shows the configuration of an LED device 2000 according to the present embodiment. The LED device 2000 includes an LED function crystal 210, a field effect transistor function crystal 220, a metal wire 240, and an attachment base wafer 206. The attachment base wafer 206 may be a Si wafer, for example.

The LED function crystal 210 includes a GaN crystal 212, an anode electrode 214, and a cathode electrode 216. The field effect transistor function crystal 220 includes a GaAs crystal 222, a gate insulation film 224, a gate electrode 226, a source electrode 228, and a drain electrode 230. The metal wire 240 connects the cathode electrode 216 to the drain electrode 230. In an example, the anode electrode 214 is connected to the power source. In this field effect transistor function crystal 220, the gate electrode 226 receives an input of the control voltage, and the source electrode 228 is grounded. The field effect transistor function crystal 220 switches the current supplied to the LED function crystal 210 according to the control voltage.

A resistance element may be provided between the cathode electrode 216 and the drain electrode 230. The LED device 2000 may include a plurality of LED function crystals 210 and a plurality of field effect transistor function crystals 220 on the attachment base wafer 206. The plurality of LED function crystals 210 and a plurality of field effect transistor function crystals 220 may be arranged in an array on the attachment base wafer 206. An exemplary device, which includes a plurality of LED function crystals 210 and a plurality of field effect transistor function crystals 220 arranged in an array, functions as an LED printer head.

EMBODIMENT EXAMPLES

The following is detailed explanation of the present invention according to embodiment examples, which does not intend to limit the present invention.

Embodiment Example No. 1

Figure 4A:
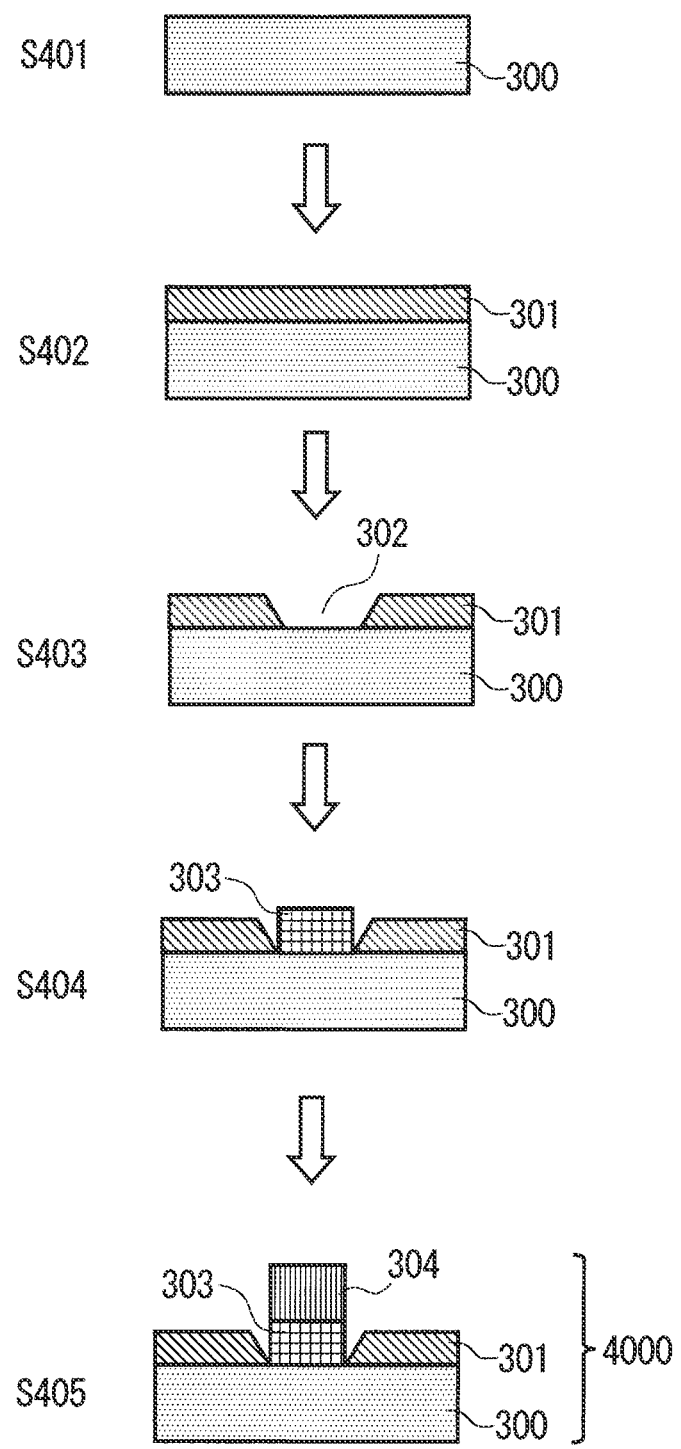
FIG. 4A shows a production process of a semiconductor wafer 4000.
Figure 4B:
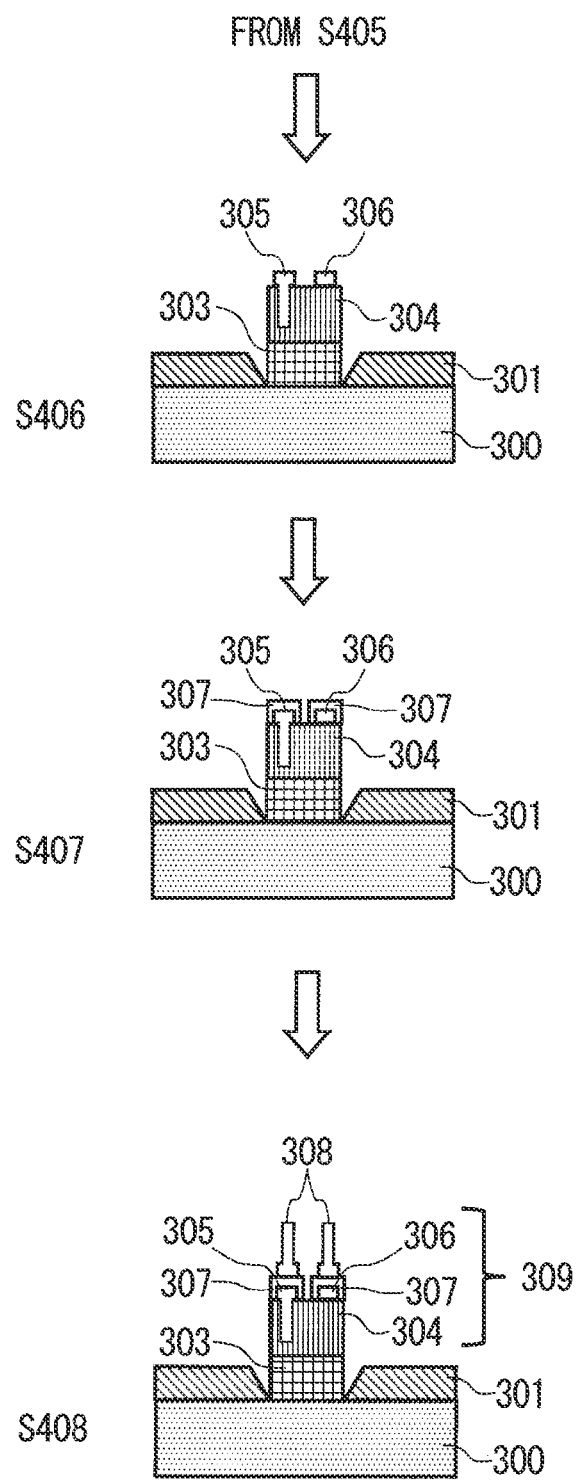
FIG. 4B shows a production process of an LED function crystal 309 obtained from a semiconductor wafer 4000.
Figure 4C:
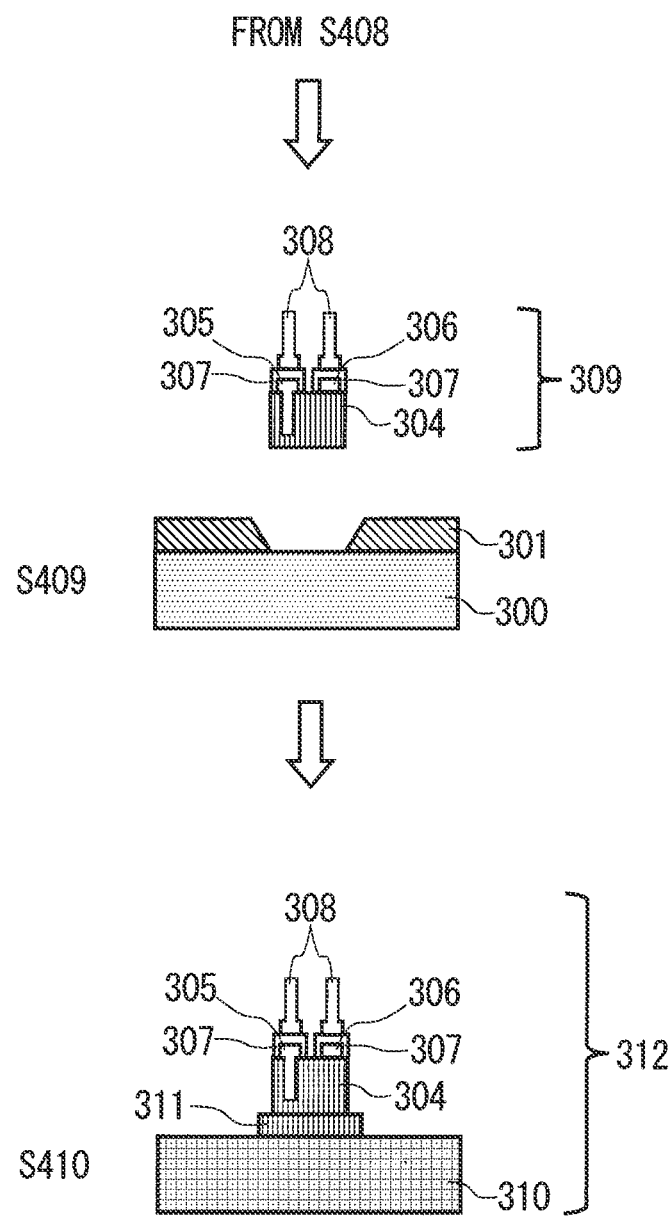
FIG. 4C shows a process of producing an LED device 312 using an LED function crystal 309 obtained from a semiconductor wafer 4000.

FIG. 4A shows a production process of a semiconductor wafer 4000. FIG. 4B shows a production process of an LED function crystal 309 obtained from a semiconductor wafer 4000. FIG. 4C shows a process of producing an LED device 312 using an LED function crystal 309 obtained from a semiconductor wafer 4000.

In S401, a Si wafer 300 having a surface having a plane orientation of (001) and an off angle of 0 degree was prepared. Next in S402, a 50 nm inhibition layer 301 made of silicon oxide was deposited on the surface of the Si wafer 300, in a thermal CVD method. Silane and oxygen were adopted as source gas. The surface temperature of the Si wafer 300 was set to 600° C.

In S403, a resist pattern having a square aperture one side of which is 200 μm was formed on the inhibition layer 301, using a stepper exposure method. The Si wafer 300 was impregnated in a 5 mass % HF solution, and the silicon oxide exposed in the aperture of the resist was removed by etching, to expose a surface of the Si wafer 300. The aperture 302 was finally formed by dissolving to remove the photoresist using acetone. The tapering angle of the sidewall of the resulting inhibition layer 301 was 15 degrees.

In S404, a Ge sacrificial layer 303, which is an example of the sacrificial layer, was formed on the surface of the Si wafer 300 exposed in the aperture 302, in a thermal CVD method. $GeH_4$ was used as a source gas. During this process, Ge was only epitaxially grown on the surface of the Si wafer 300 exposed in the aperture 302, and not on the surface of the inhibition layer 301 made of silicon oxide. The thickness of the Ge sacrificial layer 303 was set to 500 nm. Then, under the nitrogen atmosphere at 800° C., the Si wafer 300 was annealed for 10 minutes. This annealing treatment was repeated five times at 5 minute intervals.

In S405, the compound semiconductor crystal 304 made of a Group compound semiconductor crystal was epitaxially grown on the Ge sacrificial layer 303 using a MOCVD method. As source gas, trimethylaluminum, trimethylgallium, silane, diethyl zinc, and arsine were used. The wafer temperature was set to 680° C. The pressure within the growth chamber was 12 KPa.

The resulting compound semiconductor crystal 304 had a stacking structure in which stacked are n-GaAs (Si; $2 \times 10^{19}$ $cm^3$, 100 nm)/n-$Al_{0.25}Ga_{0.75}$As (Si; $2 \times 10^{18}$ $cm^3$, 300 nm)/n-$1_{0.13}Ga_{0.87}$As (Si; $2 \times 10^{17}$ $cm^3$, 70 nm)/p-$Al_{0.13}Ga_{0.87}$As (Zn; $2 \times 10^{17}$ $cm^3$, 90 nm)/p-$Al_{0.25}Ga_{0.75}$As (Zn; $2 \times 10^{18}$ $cm^3$, 300 nm)/p-GaAs (Zn; $1 \times 10^{19}$ $cm^3$, 30 nm) in this order from the Ge sacrificial layer 303. Here, the information inside the parentheses ( ) represents the doping material as well as the concentration and the thickness thereof. For example, (Si; $2 \times 10^{18}$ $cm^3$, 300 nm) represents that the layer includes silicon doping in concentration of $2 \times 10^{18}$ $cm^3$ and with a thickness of 300 nm.

In S405, the compound semiconductor crystal 304 was selectively epitaxially grown only on the plane of the Ge sacrificial layer 303 inside the aperture 302, while not deposited on the plane of the inhibition layer 301. In addition, the compound semiconductor crystal 304 was grown on the upper plane of the Ge sacrificial layer 303, but not on the side plane of the Ge sacrificial layer 303. Accordingly, the Ge sacrificial layer 303 maintained a part of its surface exposed. As a result, the semiconductor wafer 4000 having the compound semiconductor crystal 304 was produced.

In S406 of FIG. 4B, a resist was applied on the semiconductor wafer 4000, and an aperture having the same shape as the cathode shape was formed on the compound semiconductor crystal 304 by lithography. Subsequently, the semiconductor wafer 4000 was impregnated in a 4 mass % phosphoric acid solution, and the compound semiconductor crystal was etched to the depth reaching n-GaAs. Next, an Au—Ge alloy was stacked by evaporation. The semiconductor wafer 4000 was impregnated with acetone, and the resist was removed, to complete the cathode 305.

Likewise, a resist was applied to the semiconductor wafer 4000, and an aperture having the same shape as the anode shape was formed on the compound semiconductor crystal 304 by lithography. Subsequently, an Au—Zn alloy was stacked by evaporation. The semiconductor wafer 4000 was impregnated with acetone, and the resist was removed, to complete the anode 306. Further, the semiconductor wafer 4000 was annealed for 5 minutes in a nitrogen atmosphere of 380° C., to bring the anode 306 and the cathode 305 into ohmic contact.

In S407, a resist was applied to the semiconductor wafer 4000, and an aperture was formed for the compound semiconductor crystal 304 by lithography. Next, Au of 500 nm was stacked by evaporation. The semiconductor wafer 4000 was impregnated with acetone, and the resist was removed, to complete a pad 307 being a contact electrode. In S408, an aluminum wire 308 having a diameter of 250 μm was wire bonded on the pad 308 in a stud formation, as a supporting member.

Subsequently, as shown in S409 of FIG. 4C, a mixture of hydrogen peroxide solution and aqueous sodium hydroxide (10 mass % hydrogen peroxide and 0.2 N aqueous sodium hydroxide) was heated to 70° C., and the semiconductor wafer 4000 was impregnated in the heated solution for 2 minutes. The Ge sacrificial layer 303 was etched, to remove the LED function crystal 309 from the Si wafer 300.

In S410, an attachment base wafer 310, which is a Si wafer, was prepared, and a mask for photoresist was formed on the wafer surface using lithography. Next, 100 nm Au was evaporated by EB evaporation. Then the resist was removed and gold patterning was conducted. Gold having a square shape whose side is 300 μm resulted. The attachment base metal 311 thus resulted.

Next, an LED device 312 was produced by attaching the LED function crystal 309 to the attachment base metal 311. The attachment was conducted using Van der Waals bonding, with use of an optical microscope. The LED function crystal 309 was treated by a pair of tweezers by Al studs attached by wire bonding.

Embodiment Example No. 2

An LED device 312 was produced basically following the method for Embodiment Example No. 1, except that the annealing after the sacrificial layer formation was not conducted in the present embodiment. The light amount from thus produced LED device 312 was estimated as follows. That is, an optical power meter was set at a position 10 cm distant in a vertical direction from the wafer surface of the LED wafer provided with the LED device 312. Next, an electric current of 250 mA was run between the anode and the cathode of the LED device 312, to cause the optical power meter to measure the light amount.

The LED device 312 produced according to Embodiment Example No. 1 was estimated to have a light amount of 9.2 μW at the time of running a current, whereas the LED device 312 produced according to Embodiment Example No. 2 was estimated to have a light amount of 4.9 μW at the time of running a current. The device according to Embodiment Example No. 1 which was subjected to annealing had about 90% larger light amount than the light amount estimated to be output from the device according to Embodiment Example No. 2 which did not undergo annealing.

Embodiment Example No. 3

Figure 5A:
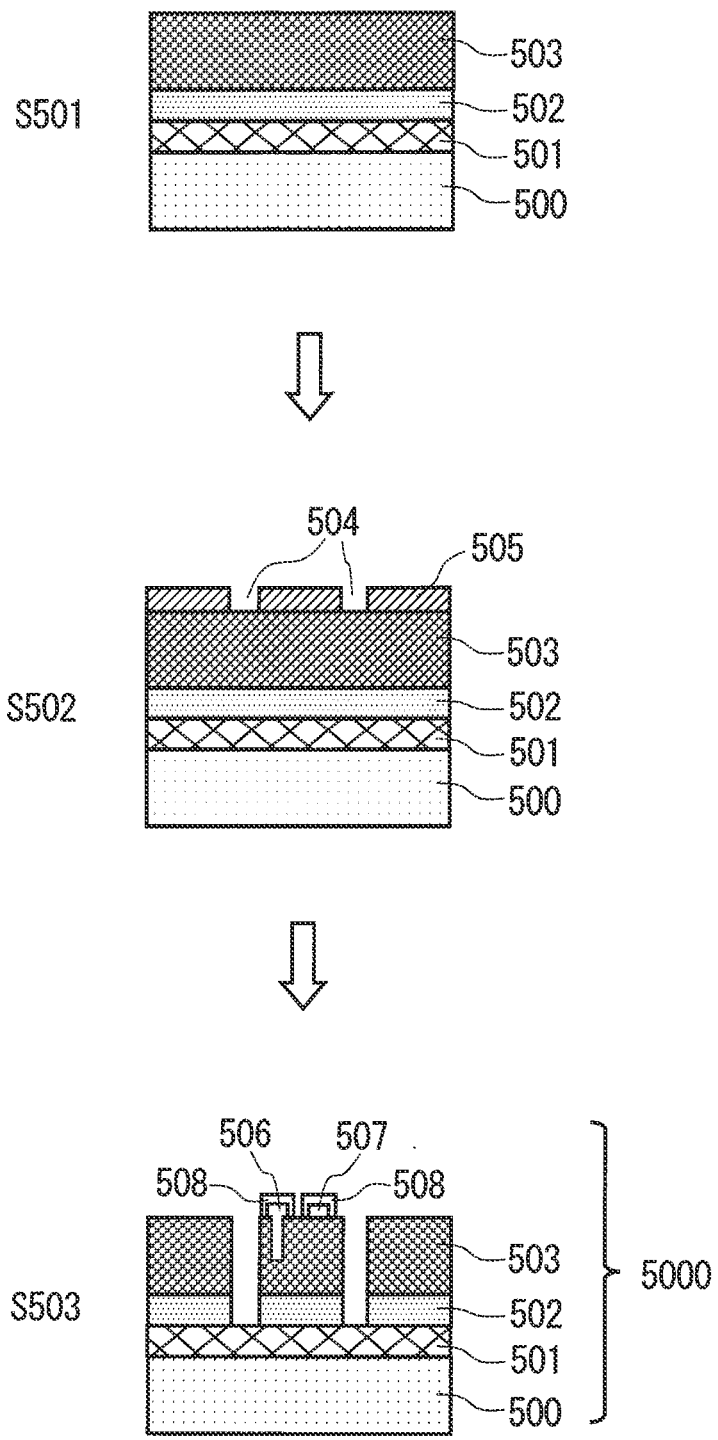
FIG. 5A shows a method for producing a semiconductor wafer 5000.
Figure 5B:
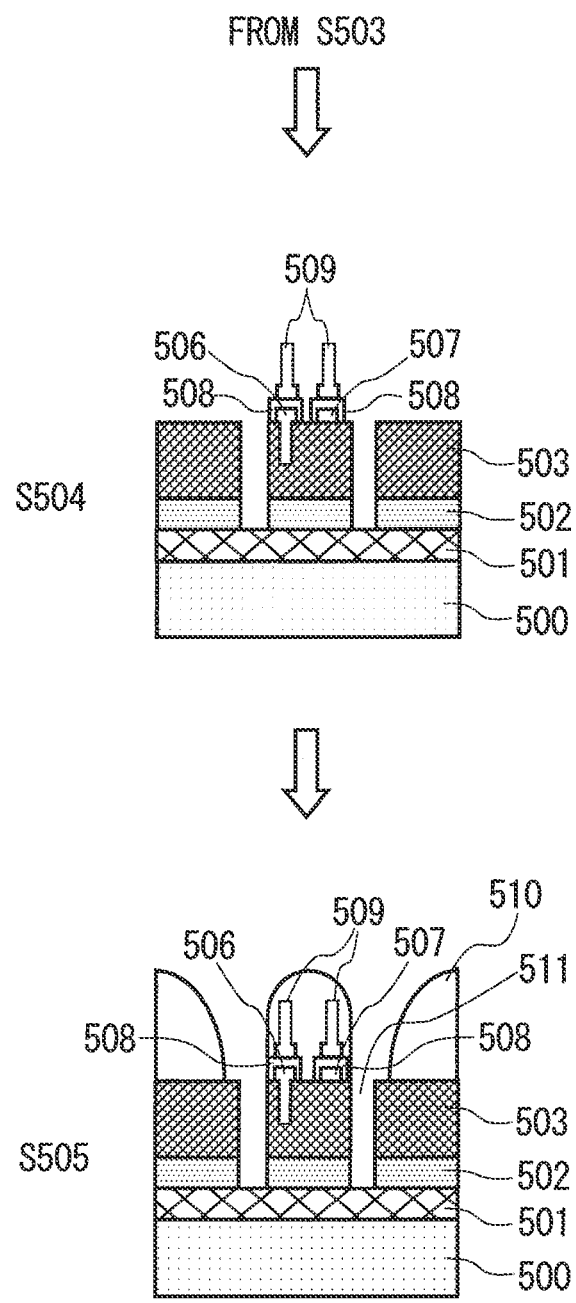
FIG. 5B shows a method for producing an LED device 515 using a semiconductor wafer 5000.
Figure 5C:
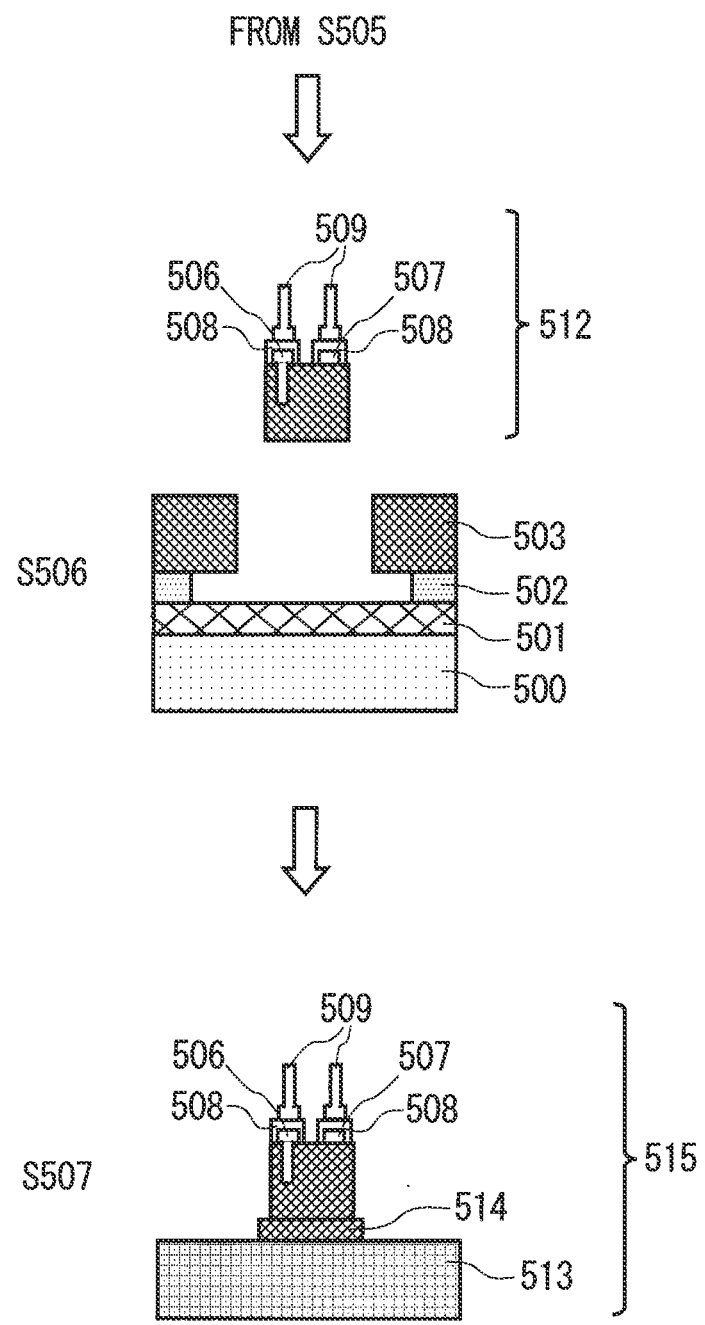
FIG. 5C shows a method for producing an LED device 515 using a semiconductor wafer 5000.

FIG. 5A shows a method for producing a semiconductor wafer 5000. FIG. 5B and FIG. 5C show a method for producing an LED device 515 using a semiconductor wafer 5000. Specifically, an LED device 515 was manufactured using a semiconductor wafer 5000 in which an etching stop layer 501 made of InGaP was formed on a GaAs wafer 500, and a sacrificial layer 502 made of AlAs was formed thereon, and then a compound semiconductor crystal 503 was formed thereon.

In S501, a GaAs wafer 500 having a (001) crystal plane with an off angle of 2 degrees was prepared. On the GaAs wafer 500, an etching stop layer 501 made of undoped In$_{0.48}$Ga$_{0.52}$P (100 nm), a sacrificial layer 502 made of undoped AlAs (20 nm), and a compound semiconductor crystal 503 were successively formed using the MOCVD method.

The resulting compound semiconductor crystal 503 has a stacking structure in which stacked are n-GaAs (Si; 2×10$^{19}$ cm$^3$, 100 nm)/n-Al$_{0.25}$Ga$_{0.75}$As (Si; 2×10$^{18}$ cm$^3$, 300 nm)/n-I$_{0.13}$Ga$_{0.87}$As (Si; 2×10$^{17}$ cm$^3$, 70 nm)/p-Al$_{0.13}$Ga$_{0.87}$As (Zn; 2×10$^{17}$ cm$^3$, 90 nm)/p-Al$_{0.25}$Ga$_{0.75}$As (Zn; 2×10$^{18}$ cm$^3$, 300 nm)/p-GaAs (Zn; 1×10$^{19}$ cm$^3$, 30 nm) in this order from the wafer. This stacking structure is the same as the structure of the compound semiconductor crystal 304 in Embodiment Example No. 1 and Embodiment Example No. 2. Here, the information inside the parenthesis ( ) represents the doping material as well as the concentration and the thickness thereof. For example, (Si; 2×10$^{18}$ cm$^3$, 300 nm) represents that the layer includes silicon doping in concentration of 2×10$^{18}$ cm$^3$ and with a thickness of 300 nm.

In S502, a resist 505 was applied on the compound semiconductor crystal 503, and a resist aperture 504 having a width of 5 μm was formed through the resist 505, so as to surround a square having 200 μm sides. In S503, the wafer provided with the resist aperture 504 was impregnated in a 2 mass % hydrogen peroxide solution containing phosphoric acid (5 mass %), thereby exposing the surface of the etching stop layer 501. Thereafter, acetone was used to dissolve the resist 505. Thus exposed compound semiconductor crystal 503 was then provided with a cathode 506, an anode 507, and a pad 508, just as explained in Embodiment Example No. 1, thereby producing the semiconductor wafer 5000.

In S504 of FIG. 5B, an aluminum wire 509 having a diameter of 250 μm was wire bonded on the pad 508 in a stud formation, as a supporting member. In S505, after a resist 510 was applied to this wafer, lithography was used to form an aperture 511 so that the resist 510 covers the cathode 506, the anode 507, the pad 508, and the aluminum wire 509 but exposes the etching stop layer.

In S506 of FIG. 5C, the wafer provided with the aperture 511 was impregnated in a 10 mass % hydrofluoric acid solution for five minutes, to dissolve the sacrificial layer 502 and remove the compound semiconductor crystal 503. In this way, the LED function crystal 512 was removed from the wafer.

In S507, just as in Embodiment Example No. 1 and Embodiment Example No. 2, the produced LED function crystal 512 was attached to the attachment base metal 514 formed on the attachment base wafer 513, thereby producing the LED device 515, and the light amount therefrom was estimated. The LED device 515 in Embodiment Example No. 3 was estimated to have a light amount of 4.1 μW at the time of running a current. The smaller light amount obtained in this conventional method for using an InGaP etching stop layer 501 and an AlAs sacrificial layer 502 is attributed to the increase in crystal defect in the compound semiconductor crystal 503.

As explained so far, a compound semiconductor crystal removed from a base wafer can be produced using a low-cost Si wafer as a base wafer. Furthermore, an LED device was shown to be produced by attaching the compound semiconductor crystal to another wafer. The LED device obtained according to the present embodiment has exhibited a larger light amount than that LED devices resulting from conventional methods. According to the present invention, a GaAs layer having fewer defects can be directly formed on a wafer whose surface is made of Si.

The invention claimed is:

1. A method for producing a compound semiconductor crystal, comprising:
    an inhibition layer formation step of forming an inhibition layer on a base wafer whose surface is made of a silicon crystal;
    an aperture formation step of etching the inhibition layer and forming, in the inhibition layer, an aperture in which a part of the base wafer is exposed;
    a sacrificial layer formation step of crystal growing a sacrificial layer containing $C_{x1}Si_{y1}Ge_{z1}Sn_{1-x1-y1-z1}$ (0≤x1<1, 0≤y1≤1, 0≤z1≤1, and 0<x1+y1+z1≤1), only on the part of the base wafer exposed by the aperture;
    a crystal formation step of forming, only on the sacrificial layer, a compound semiconductor crystal lattice-matching or pseudo lattice-matching the sacrificial layer, such that a part of the sacrificial layer is kept in an exposed state; and
    a crystal removal step of removing the compound semiconductor crystal from the base wafer, by etching the sacrificial layer, wherein
    the inhibition layer inhibits growth of the sacrificial layer and the compound semiconductor crystal at a portion other than the part of the base wafer exposed by the aperture,
    the inhibition layer has a thickness of 2 nm to 500 nm, and
    the compound semiconductor crystal is a Group III-V compound semiconductor crystal that includes at least one of Al, Ga, In as a Group III element, and at least one of N, P, As, Sb as a Group V element.

2. The method according to claim 1 for producing a compound semiconductor crystal, wherein
    in the crystal removal step, the compound semiconductor crystal is etched selectively with respect to the sacrificial layer.

3. The method according to claim 1 for producing a compound semiconductor crystal, wherein
    the crystal formation step includes a first growth step of growing the compound semiconductor crystal at a temperature in the range of from 400° C. to 600° C., and a second growth step of further growing the compound semiconductor crystal at a temperature higher than the growth temperature adopted in the first growth step.

4. The method according to claim 1 for producing a compound semiconductor crystal, wherein
    a gap is created between the sacrificial layer and the inhibition layer during the sacrificial layer formation step.

5. The method according to claim 1 for producing a compound semiconductor crystal, further comprising, between the crystal formation step and the crystal removal step,
    a step of annealing the sacrificial layer.

6. The method according to claim 5 for producing a compound semiconductor crystal, wherein
    the annealing in the step of annealing is conducted twice or more times.

7. The method according to claim 1 for producing a compound semiconductor wafer, wherein
    the inhibition layer is a silicon oxide layer, a silicon nitride layer, a silicon oxynitride layer, an aluminum oxide layer, or a stack of two or more of the preceding layers.

8. The method according to claim 1 for producing a compound semiconductor crystal, further comprising, between the crystal formation step and the crystal removal step,
    a step of supporting the compound semiconductor crystal by a supporting member.

9. A method for producing an electronic device, comprising a step of forming a function crystal in which the compound semiconductor crystal obtained by the method according to claim 1 has been provided with an electrode and wiring.

10. The method according to claim 9 for producing an electronic device, further comprising:
a step of preparing an attachment base wafer that is different from the base wafer; and
a step of attaching the function crystal to the attachment base wafer.

11. The method according to claim 10 for producing an electronic device, comprising
a step of attaching a plurality of said function crystals to the attachment base wafer.

12. A semiconductor wafer comprising:
a base wafer whose surface is made of a silicon crystal;
an inhibition layer provided on the base wafer, the inhibition layer including an aperture in which a part of the base wafer is exposed and being to inhibit crystal growth at a portion other than the part of the base wafer exposed by the aperture, wherein the inhibition layer is etched to form the aperture in the inhibition layer;
a sacrificial layer formed only on the part of the base wafer exposed inside the aperture, the sacrificial layer containing $C_{x1}Si_{y1}Ge_{z1}Sn_{1-x1-y1-z1}$ ($0 \le x1 < 1$, $0 \le y1 \le 1$, $0 \le z1 \le 1$, and $0 < x1+y1+z1 \le 1$); and
a compound semiconductor crystal provided only on the sacrificial layer, the compound semiconductor crystal containing a compound semiconductor lattice-matching or pseudo lattice-matching the sacrificial layer, wherein
the sacrificial layer has an etching rate greater than an etching rate of the compound semiconductor crystal,
the semiconductor wafer has a gap between the sacrificial layer and the inhibition layer,
the inhibition layer has a thickness of 2 nm to 500 nm, and
the compound semiconductor crystal is a Group III-V compound semiconductor crystal that includes at least one of Al, Ga, In as a Group III element, and at least one of N, P, As, Sb as a Group V element.

13. The semiconductor wafer according to claim 12, wherein
a direction in which a sidewall of the inhibition layer facing the aperture is tilted with respect to a stacking direction in which the base wafer and the sacrificial layer are stacked is 0.5 degrees or more.

14. The semiconductor wafer according to claim 12, wherein
the compound semiconductor crystal is made of GaAs, AlGaAs, GaN, or AlGaN, and the sacrificial layer is made of Ge or SiGe.

15. A method for producing a compound semiconductor crystal, comprising:
an inhibition layer formation step of forming an inhibition layer on a base wafer whose surface is made of a silicon crystal;
an aperture formation step of etching the inhibition layer and forming, in the inhibition layer, an aperture in which a part of the base wafer is exposed;
a sacrificial layer formation step of crystal growing a sacrificial layer containing $C_{x1}Si_{y1}Ge_{z1}Sn_{1-x1-y1-z1}$ ($0 \le x1 < 1$, $0 \le y1 \le 1$, $0 \le z1 \le 1$, and $0 < x1+y1+z1 \le 1$), only on the part of the base wafer exposed by the aperture;
a step of bringing a plane of the sacrificial layer into contact with a gas containing a phosphorous compound, the plane facing the compound semiconductor crystal;
a crystal formation step of forming, only on the sacrificial layer, a compound semiconductor crystal lattice-matching or pseudo lattice-matching the sacrificial layer, such that a part of the sacrificial layer is kept in an exposed state; and
a crystal removal step of removing the compound semiconductor crystal from the base wafer, by etching the sacrificial layer, wherein the step of bringing the plane of the sacrificial layer into contact with the gas containing the phosphorous compound is between the sacrificial layer formation step and the crystal formation step,
the inhibition layer inhibits growth of the sacrificial layer and the compound semiconductor crystal at a portion other than the part of the base wafer exposed by the aperture,
the inhibition layer has a thickness of 2 nm to 500 nm, and
the compound semiconductor crystal is a Group III-V compound semiconductor crystal that includes at least one of Al, Ga, In as a Group III element, and at least one of N, P, As, Sb as a Group V element.

\* \* \* \* \*